US006941499B1

(12) United States Patent
Sung et al.

(10) Patent No.: US 6,941,499 B1
(45) Date of Patent: Sep. 6, 2005

(54) METHOD TO VERIFY THE PERFORMANCE OF BIST CIRCUITRY FOR TESTING EMBEDDED MEMORY

(75) Inventors: Nai-Yin Sung, Hsin-Chu (TW); Ming-Chyuan Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 247 days.

(21) Appl. No.: 09/883,449

(22) Filed: Jun. 18, 2001

(51) Int. Cl.[7] .............................................. G06F 11/00
(52) U.S. Cl. ....................... 714/741; 714/718; 703/15
(58) Field of Search ............................. 714/741, 703, 714/718, 720; 703/15

(56) References Cited

U.S. PATENT DOCUMENTS

| 4,782,488 | A | * | 11/1988 | Anderson | 713/190 |
|---|---|---|---|---|---|
| 5,475,624 | A | * | 12/1995 | West | 703/15 |
| 5,513,339 | A | * | 4/1996 | Agrawal et al. | 703/15 |
| 5,748,641 | A | * | 5/1998 | Ohsawa | 714/720 |
| 5,822,228 | A | * | 10/1998 | Irrinki et al. | 714/718 |
| 5,844,914 | A | * | 12/1998 | Kim et al. | 714/718 |
| 6,012,157 | A | * | 1/2000 | Lu | 714/741 |
| 6,601,205 | B1 | * | 7/2003 | Lehmann et al. | 714/741 |

OTHER PUBLICATIONS

"SynTest Enters the BIST Product", SynTest Technologies, Inc., Mar. 1999, http://www.syntest.com/PressReleaseArchive/19990308_2.htm.*
J. Dreibelbis et al., "Processor-Based Built-In Self-Test for Embedded DRAM", IEEE Journal of Solid-State Circuits, vol. 33, No. 11, Nov. 1998, pp 1731-1740.*
Built-In Self-Test (BIST) Using Boundary Scan:, Texas Instruments Corp., Dec. 1996, pp 1-8.*
I. Burgess, "Test and Diagnosis of Embedded Memory Using BIST", Mentor Graphics Corp., Sep. 2000, pp 1-6.*
J. Dreibelbis, et al., "Processor-Based Buit-In Self-Test for Embedded DRAM", IEEE Journal of Solid-State Circuits, vol. 33, No. 11, Nov. 1998, pp. 1731-1740.
"Built-In Self-Test (BIST) Using Boundary Scan", Texas Instruments Corp., Dec. 1996, pp. 1-8.
I. Burgess,"Test and Diagnosis of Embedded Memory Using BIST," Mentor Graphics Corp., Sep. 2000, pp. 1-6.

* cited by examiner

*Primary Examiner*—Albert Decady
*Assistant Examiner*—John P. Trimmings

(57) ABSTRACT

A new method and apparatus to verify the performance of a built-in self-test circuit for testing embedded memory in an integrated circuit device is achieved. A set of faults is introduced into an embedded memory behavior model. The embedded memory behavior model comprises a high-level language model. Each member of the set of faults comprises a finite state machine state, a memory address, and a memory data fault. The built-in self-test circuit and the embedded memory behavior model are then simulated. The built-in self-test circuit generates input data and address patterns for the embedded memory behavior model. The embedded memory behavior model outputs memory address and data in response to the input data and address patterns. The input address and data and the memory address and data are compared in the built-in self-test circuit and a fault output is generated if not matching. The fault output and the set of faults are compared to verify the performance of the built-in self-test circuit.

18 Claims, 4 Drawing Sheets

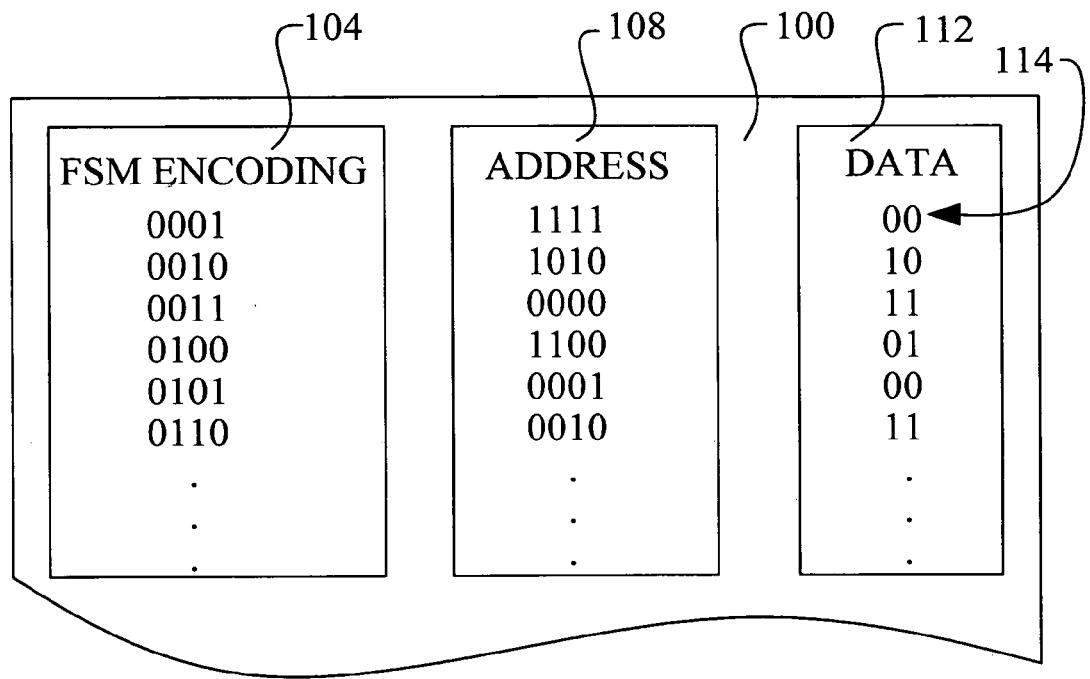
FIG. 5  EMBEDDED FAULTS DATABASE
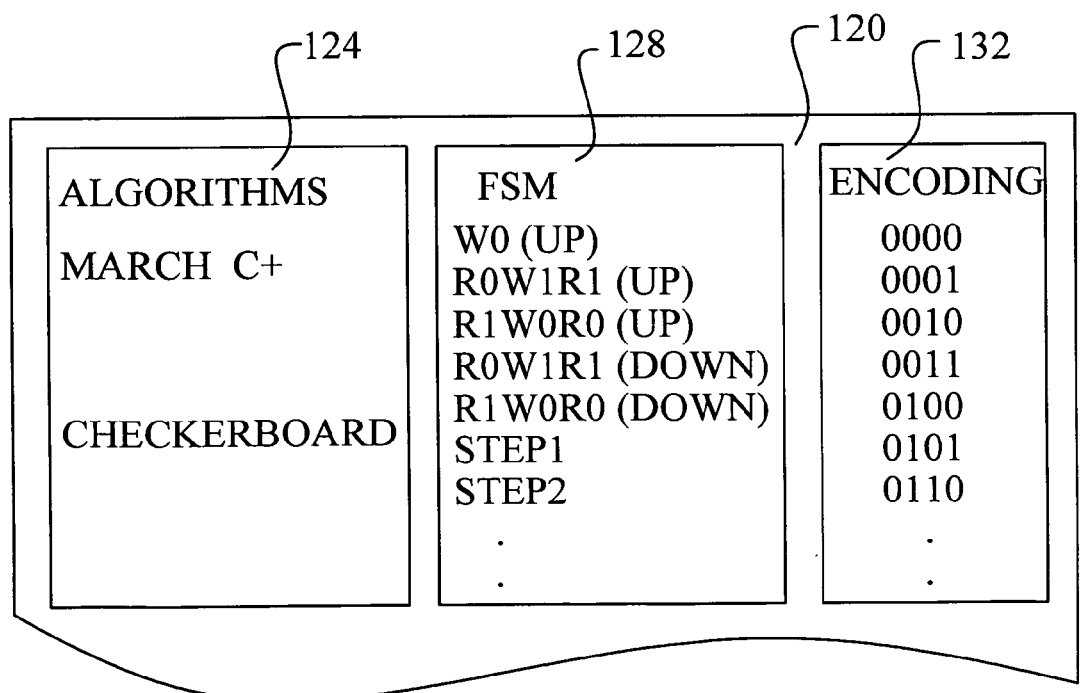
FIG. 6  ALGORITHM EXAMPLES

METHOD TO VERIFY THE PERFORMANCE OF BIST CIRCUITRY FOR TESTING EMBEDDED MEMORY

BACKGROUND OF THE INVENTION

(1) Field of the Invention

The invention relates to testing the performance of a built-in self-test (BIST) circuit, and more particularly, to a method and an apparatus for testing the performance of a BIST circuit in detecting faults in an embedded memory during the design phase.

(2) Description of the Prior Art

As deep sub-micron ASIC and IC technology evolves, greater numbers of IC devices are being designed and fabricated with embedded memories. Consequently, the industry requires an automated test strategy for embedded memories. Device testing requires a mechanism to apply a stimulus to a device under test, to acquire the device's response, and to analyze and compare that response with a known good (non-faulty) response. Classical IC testing procedures utilize external test patterns as the stimulus. These patterns are applied to the device under test using an automated tester. The tester examines the device response to stimulus and compares it against the known good response that has been stored in the tester as part of the test pattern data.

Another approach to verifying the corrected operation of an integrated circuit device is the built-in self-test (BIST) circuit. BIST circuits place the function of the external, automated tester within the IC chip itself. In a BIST circuit, a finite state machine (FSM) is used to generate stimulus and to analyze the response of the part of the integrated circuit that is under test. The BIST circuitry interfaces also with the higher-level system.

Referring now to FIG. 1, a block-level arrangement of a BIST circuit 10 and an embedded memory 14 is shown. The system-level input and outputs are DIN 15, DOUT 16, TEST 19, and STATUS 20. DIN 15 and DOUT 16 are byte-wide or word-wide data buses, including access control signals, used by the integrated circuit system. Under normal operating conditions, the TEST signal 19 is in the inactive state. In this condition, the BIST circuit 10 is bypassed and the system has direct access to the embedded memory data through data buses BDIN 17 and BDOUT 18.

During test mode, however, the TEST signal 19 is activated. In this mode, the BIST circuit 10 has access to the embedded memory 14. The BIST circuit 10 can run a self-test function and provide a pass/fail indication and "test done" indication back to the system through the STATUS signal 20.

It is very important that the BIST circuit design and algorithm accurately detect faults in the embedded memory. The BIST circuit must therefore be systematically verified. Circuit design and verification for a traditional hardware circuit is illustrated in FIG. 2. The traditional circuit design process may begin at a high level wherein functional blocks are created and linked together. The design proceeds to the register transfer level (RTL) 22 wherein time data bus processing of byte wide or word wide data is reflected in the design. The RTL design 22 is then synthesized 24 to a gate level design 32. At the gate level, individual logic gates are used to form the various registers and random logic used to create the circuit.

At the gate level 32, it is possible to carry out traditional verification 28. In a traditional verification scheme, the gate level 32 circuit schematic is entered into a computer-aided design (CAD) program so that a netlist can be generated for computer simulation. Test patterns 36 can then be generated in a simulation tool. Simulations 40 are run using the gate level circuit. The performance of the gate level design 32 can thereby be tested using a set of test patterns 36. Further, the rigorousness of the test patterns 36 themselves can be evaluated by fault grading the patterns against the circuit design using traditional "stuck at" faulting of nodes within the gate level design 32.

However, it is found that the traditional hardware design flow of FIG. 2 is not sufficient for verifying the performance of a BIST circuit in detecting faults within the embedded memory. This insufficiency stems from the fact that the BIST circuit, itself, generates the test patterns. Therefore, the designer losses the ability to tailor the patterns to detect memory faults. A new design verification method for BIST circuits and embedded memory is needed.

Several prior art inventions describe BIST circuits and methods. U.S. Pat. No. 6,012,157 to Lu teaches a system to evaluate the effectiveness of a BIST controller by simulation. Lu does not address scrambling and descrambling physical and logical addresses. U.S. Pat. No. 5,822,228 to Irrinki et al discloses a method for measuring propagation delays of embedded cores and of integrated circuits. A BIST generator and a test compactor are used to simulate the device and to latch results. U.S. Pat. No. 5,513,339 to Agrawal et al teaches a method to simulate a circuit containing both logic gates and memory blocks to determine fault detection. Concurrent simulation and record removal are used to speed up the simulation. U.S. Pat. 5,475,624 to West discloses a method to aid development of fault detection test patterns using emulators. A 'good' emulator and a 'faulted' emulator are exercised with the same test pattern to test the pattern's effectiveness at detecting faults.

J. Dreibelbis, et al, 'Processor-Based Built-In Self-Test for Embedded DRAM," IEEE Journal of Solid-State Circuits, Vol. 33, No. 11, November 1998, pp. 1731–1740, teaches a BIST circuit wherein additional flexibility is achieved through the use of processor elements, such as an instruction counter, a instruction memory, and a branch controller. "Built-In Self-Test (BIST) Using Boundary Scan," Texas Instruments Corp., December 1996, pp. 1–8, discloses a boundary scan test architecture that supports BIST. I. Burgess, "Test and Diagnosis of Embedded Memory Using BIST," Mentor Graphics Corp., September 2000, pp. 1–6, teaches an augmentation to a BIST controller to enable a scan out of failed memory data to aid in diagnosis.

SUMMARY OF THE INVENTION

A principal object of the present invention is to provide an effective method to verify the performance of a built-in self-test (BIST) circuit for testing embedded memory in an integrated circuit device.

A further object of the present invention is to provide a method to simulate a BIST circuit and an embedded memory behavior model.

A yet further object of the present invention is to verify the effectiveness of a BIST at detecting faults in an embedded memory by introducing a set of faults into the memory model.

Another yet further object of the present invention is to allow customization of the fault performance of the embedded memory using an expected faults database.

Another yet further object of the present invention is to customize the fault performance of the embedded memory depending on a particular FSM command.

Another yet further object of the present invention is to provide a method to simulate the performance of a generic BIST circuit on a particular embedded memory architecture by providing necessary scrambling and descrambling of physical and logical address and data signals.

Another object of the present invention is to provide an apparatus to verify the performance of a BIST circuit for testing an embedded memory in an integrated circuit device.

A further object of the present invention is to provide an apparatus wherein the performance of a BIST circuit is verified using a means of introducing a set of faults into an embedded memory behavior model.

In accordance with the objects of this invention, a new method to verify the performance of a built-in self-test circuit for testing embedded memory in an integrated circuit device is achieved. A set of faults is introduced into an embedded memory behavior model. The embedded memory behavior model comprises a high-level language model. Each member of the set of faults comprises a finite state machine state, a memory address, and a memory data value. The built-in self-test circuit and the embedded memory behavior model are then simulated. The built-in self-test circuit generates input data and address patterns for the embedded memory behavior model. The embedded memory behavior model outputs memory address and data in response to the input data and address patterns. The input address and data and the output address and data are compared in the built-in self-test circuit and a fault output is generated if not matching. The fault output is compared to the introduced set of faults to verify the performance of the built-in self-test circuit.

Also in accordance with the objects of this invention, a new apparatus to verify the performance of a built-in self-test circuit for testing embedded memory in an integrated circuit device is achieved. The apparatus first comprises an embedded memory behavior model in a high-level language. A built-in self-test circuit model is connected to the embedded memory behavior model. The built-in self-test circuit model generates input data and address patterns for the embedded memory behavior model. The embedded memory behavior model outputs memory address and data in response to the input data and address patterns. The memory address and data are compared to the input address and data in the built-in self-test circuit and a fault output is generated if not matching. A means of introducing a set of faults into the embedded memory behavior model is included. Each member of the set of faults comprises a finite state machine state, a memory address, and a memory data fault. A means of simulating the embedded memory behavior model and the built-in self-test circuit model is included. Finally, a means of comparing the fault diagnosis output of the built-in self-test circuit model and the introduced set of faults is included to thereby verify the performance of the built-in self-test circuit.

BRIEF DESCRIPTION OF THE DRAWINGS

In the accompanying drawings forming a material part of this description, there is shown:

FIG. 5 illustrates the preferred embodiment of the database file for introducing the set of faults into the embedded memory.

FIG. 6 illustrates a BIST algorithm for testing the embedded memory.

DESCRIPTION OF THE PREFERRED EMBODIMENTS

The preferred embodiment discloses the method and the apparatus of BIST verification of the present invention. It should be clear to those experienced in the art that the present invention can be applied and extended without deviating from the scope of the present invention.

Figure 1:
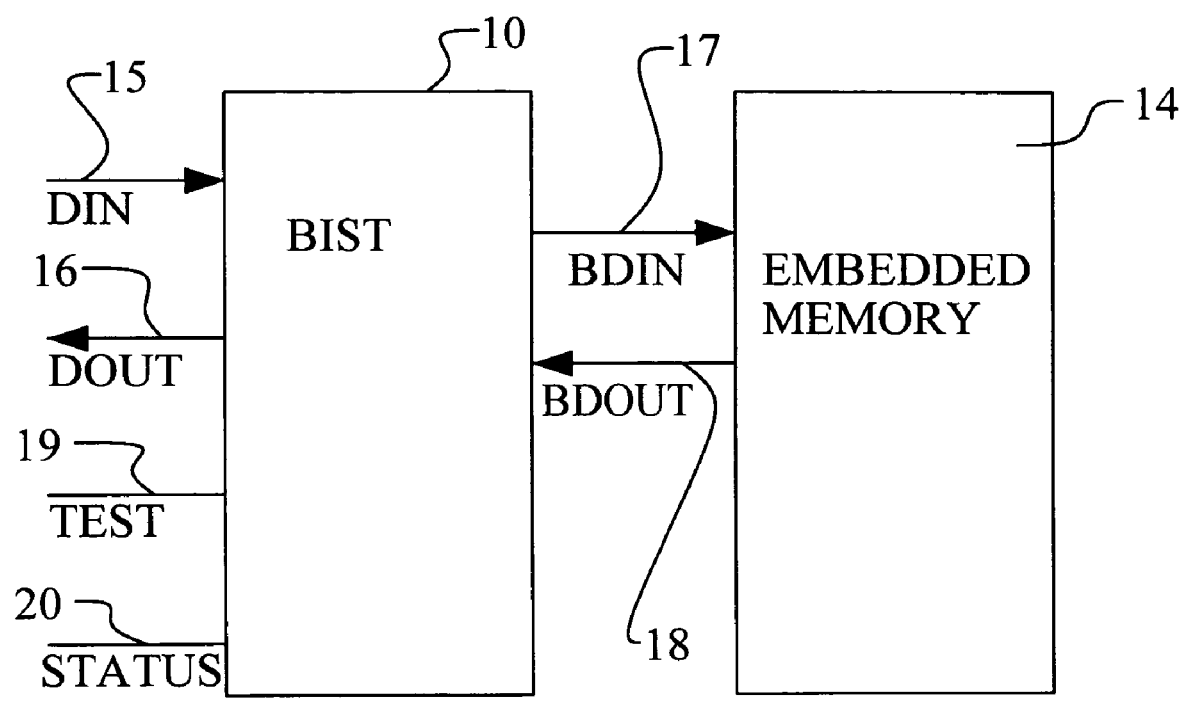
FIG. 1 illustrates a block-level arrangement of a BIST circuit and an embedded memory.
Figure 2:
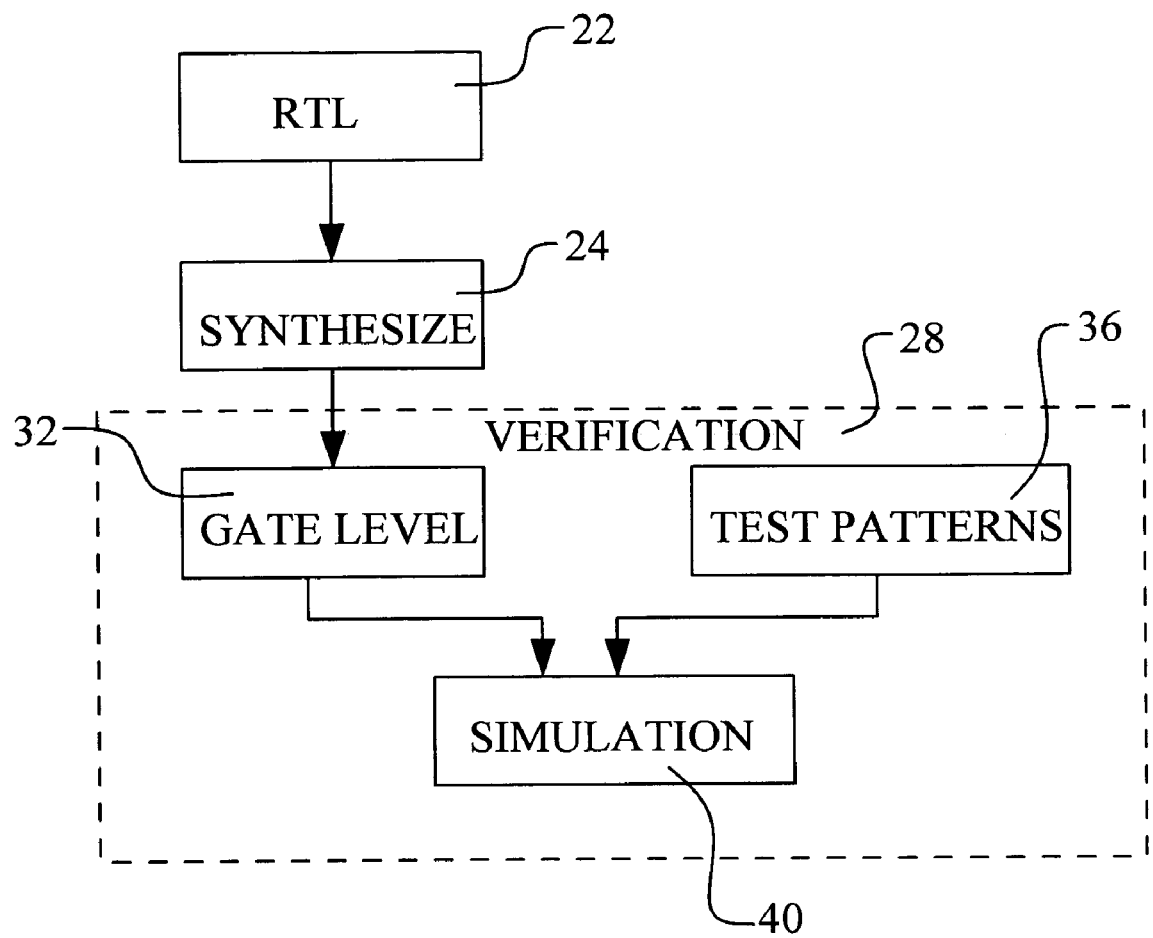
FIG. 2 illustrates a traditional hardware circuit design and verification approach.
Figure 3:
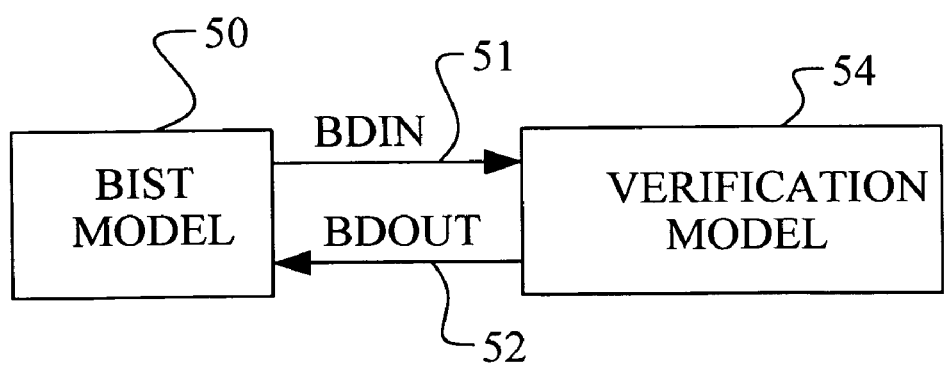
FIG. 3 illustrates the block level relationship between the BIST circuit and the verification model of the present invention.

Referring now particularly to FIG. 3, the block level relationship between the BIST circuit 50 and the verification model 54 of the present invention is illustrated. The BIST circuit 50 may be modeled at the register transfer level (RTL) or the gate level. The BIST circuit model 50 interfaces to the Verification model 54 primarily through the BDIN 51 and BDOUT 52 buses. BDIN 51 is the input data bus for the embedded memory and comprises, for example, address, data, and control signals. The BIST controls the BDIN bus 51. BDOUT 52 is the output data bus from the embedded memory. BDOUT 52 comprises, for example, address, data, and control signals.

The verification model 54 comprises the embedded memory and the system for introducing faults into the embedded memory. Preferably, the verification model 54 is constructed using a high level language, such as VHDL or Verilog.

Figure 4:
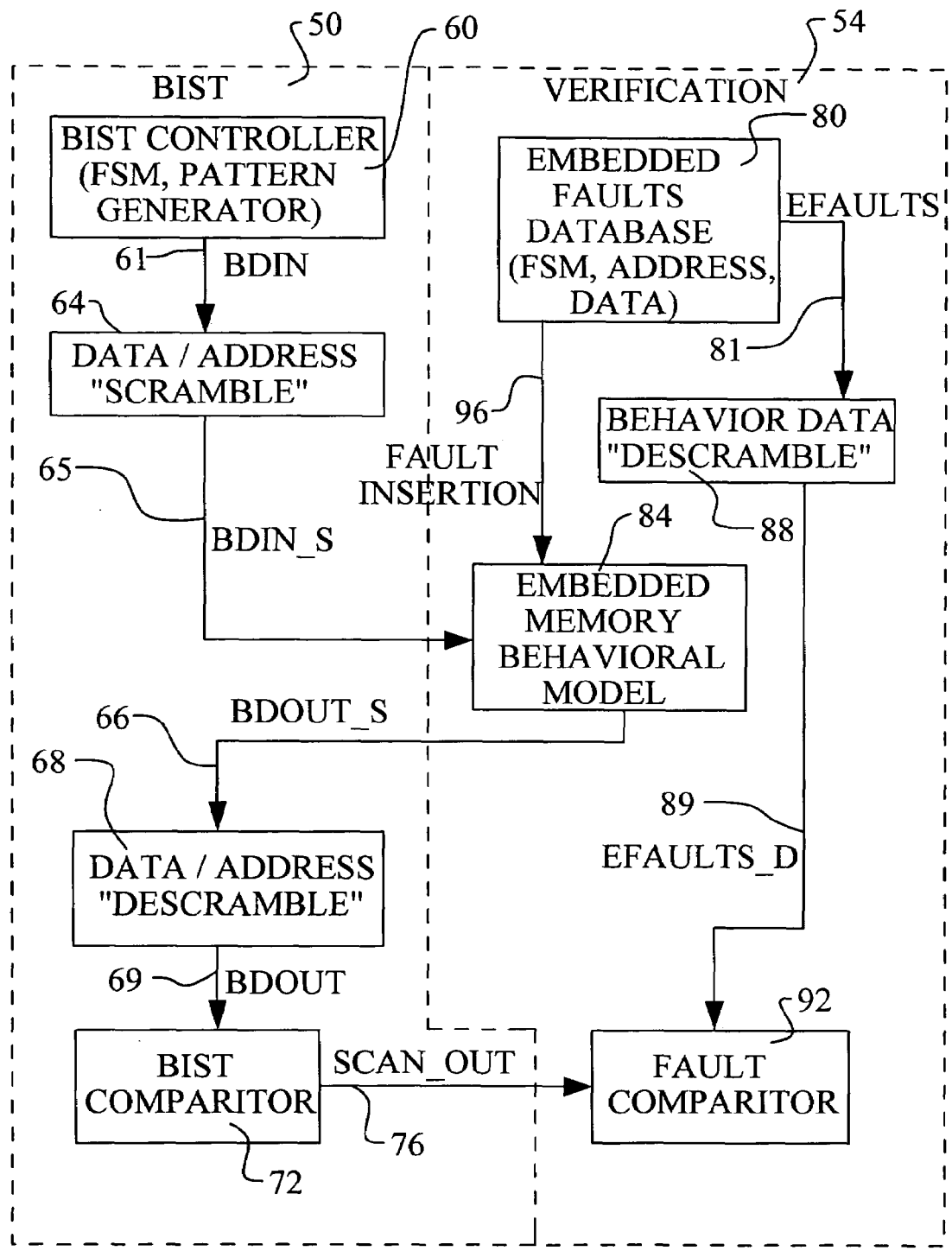
FIG. 4 illustrates the preferred embodiment of the BIST circuit and the verification model of the present invention.

Referring now to FIG. 4, several important features of the preferred embodiment of the present invention are illustrated. The BIST block 50 is divided into four sub-blocks 60, 64, 68, and 72. The BIST Controller block 60 comprises a finite state machine (FSM) and a pattern generator circuit. The FSM is programmable to execute a particular sequence of tests on the embedded memory. During each test, a pattern of data is written to an address in the memory. This data may then be read back from the memory to see if any errors have occurred. Examples of particular algorithms that may be used include, for example, March C+, Checkerboard, March A, March B, Diagonal, and Walking 0/1. Each algorithm has the ability to detect different types of faults in the memory block. The simulation method and the apparatus of the present invention allows the designer to test the performance of various algorithms.

The BIST Controller 60 sends out the memory data, address, and commands in the data bus, BDIN 61. The BDIN bus 61 is processed through a Data/Address "Scramble" Block 64 before entering the Embedded Memory Behavioral Model 84. The Data/Address "Scramble" Block 64 is a key feature of the present invention. The BIST Controller 60 may be a generic circuit. Therefore, the logical arrangement of the BDIN bus 61 information is fixed. The "Scramble" block maps the logical configurations of the BDIN bus 61 onto the physical architecture used in an embedded memory. The Data/Address "Scramble" Block outputs the data bus in correctly scrambled format as BDIN_S. The Data/Address "Scramble" block 64 increases the flexibility of the verification method and apparatus of the present invention.

The Embedded Memory Behavioral Model 84 will be described in detail below. The output of the Embedded Memory Behavioral Model 84 is the bus BDOUT_S 66. Once again, this bus is "scrambled" with respect to the logical arrangement expected by the generic BIST design. Therefore, a Data/Address "Descramble" Block 68 is used to rearrange the BDOUT_S bus 66 to the appropriately "descrambled" BDOUT 69. This is another important feature of the preferred embodiment.

The BDOUT data 69 represents the Embedded Memory Behavioral Model 84 response to a READ by the BIST Controller 60. Typically, in most algorithms, the BIST circuit first performs a WRITE to a location and then a READ from that same location. A comparison of the WRITE data and the READ data will uncover any faults in that part of the memory. The BIST Comparator block 72 performs this comparison. The BIST Comparator block 72 output, SCAN_OUT 76, reports fault information to the chip. The SCAN_OUT 76 information may include the address and data of the faulted location.

The Verification Model 54 is a very important feature in the present invention. The BIST Model 50 represents the actual circuitry that will be designed into the IC chip. The Verification Model 54, by comparison, is mainly a verification tool. The Verification Model 54 comprises four sub-blocks 80, 84, 88, and 92 and a means of simulating the embedded memory behavior model and the BIST model.

The Embedded Memory Behavioral Model block 84 is a high-level language model of the embedded memory design. The Embedded Memory Behavioral Model 84 may be written, for example, in VHDL or Verilog. The Embedded Memory Behavioral Model 84 describes the behavior of the embedded memory as it would function in the IC design. The BDIN_S 65 and BDOUT_S 66 buses provide data and address interface to the BIST model 50.

The Embedded Faults Database 80 comprises a set of faults and a means of introducing these faults 96 into the Embedded Memory Behavioral Model 84. Each record in the Embedded Faults Database 80 comprises a finite state machine state, a memory address, and a memory data value. The data values for specific locations in the embedded memory can be "stuck at" zero or one to thereby simulate a faulted condition. Alternatively, memory locations can be left unfaulted to simulate normal performance. Further, particular FSM commands can be associated with "stuck at" conditions so that the memory faults display "real world" inserted 96, into the Embedded Memory Behavioral Model 84 from the Embedded Faults Database 80 prior to simulation. The use of a separate Embedded Faults Database 80 allows the Embedded Memory Behavioral Model 84 to be altered by the introduction of faults by simple changes in the database file. Changes in the behavioral model 84 are not required.

The expected faults data, EFAULTS 81, must be "descrambled" for comparison with the BIST output, SCAN_OUT 76 in the Fault Comparator block 92. The Behavior Data "Descramble" Block 88 "descrambles" the physical bus format used in the Embedded Memory Behavioral Model 84 to create EFAULTS_D 89 that fits the BIST format.

The Fault Comparator block 92 compares SCAN_OUT 76 and EFAULTS_D 89. Ideally, the BIST 50 detects every form of fault introduced into the Embedded Memory Behavioral Model 84 by the Verification Model 54. In practice, however, each algorithm used by the BIST is selective in identifying particular faults. A graphical or textual record of the Fault Comparator block 92 results helps to identify the performance strengths and weaknesses of each approach.

Referring now to FIG. 5, the contents of the Embedded Faults Database 100 are shown. The Embedded Faults Database 100 comprises a data file with a series of records that encode the fault performance to be introduced into the Embedded Memory Behavioral Model. Each record preferably comprises a FSM Encoding 104, an Address 108, and a Data value 112. For example, the first record contains a FSM Encoding of '0001', an Address of '1111' and a data value of '00'. The '00' data value causes a "stuck at zero" condition 114 for the data bits at physical address location '1111' in the Embedded Memory Behavioral Model. Further, the inclusion of the FSM Encoding means that this "stuck at zero" response will occur when the '0001' action is performed by the BIST controller. In this way, a given memory location can be made to respond differently to different BIST actions. Sometimes the location will appear faulted and other times not faulted. The data locations may be "stuck at zero" or "stuck at one."

Referring now to FIG. 6, examples of BIST algorithms encoded into the BIST controller are shown. The BIST finite state machine (FSM) logic is structured to decode particular encoded commands and to then perform particular functions. Two algorithms 124 are shown. The MARCH C+ algorithm performs a series of WRITE and READ sequences at memory locations. The CHECKERBOARD algorithm performs a stepping sequence. Each step of a particular algorithm is programmed using a FSM command 128. Each command 128 is further machine encoded 132 into a binary string. For example, the '0001' encoded command referenced in FIG. 5, translates to the FSM command 'R0W1R1 (UP)' in the MARCH C+ algorithm.

The advantages of the present invention may now be summarized. First, the present invention provides a method and an apparatus to verify the fault detection performance of a BIST circuit on an embedded memory. Second, the present invention allows the designer to customize the fault performance of the embedded memory using an expected faults database. Third, fault performance of the embedded memory may depend on the particular FSM command performed. Finally, the present invention facilitates the use of a generic BIST data and address format through the provision of scramble and descramble blocks to fit the data and address of the generic BIST to a particular embedded memory architecture.

As shown in the preferred embodiments, the novel method and apparatus of the present invention provide an effective means of testing the performance of a BIST circuit and algorithm.

While the invention has been particularly shown and described with reference to the preferred embodiments thereof, it will be understood by those skilled in the art that various changes in form and details may be made without departing from the spirit and scope of the invention.

What is claimed is:

1. A method to verify the performance of a built-in self-test circuit for testing embedded memory in an integrated circuit device comprising:

introducing a set of faults into an embedded memory behavior model wherein said embedded memory behavior model comprises a high-level language model and wherein each member of said set of faults comprises a finite state machine state, a memory address, and a memory data fault;

thereafter simulating said built-in self-test circuit and said embedded memory behavior model wherein said built-in self-test circuit generates input data and address patterns for said embedded memory behavior model, wherein said embedded memory behavior model outputs memory address and data in response to said input data and address patterns, and wherein said input address and data and said memory address and data are compared in said built-in self-test circuit and a fault output is generated if not matching;

de-scrambling said set of faults; and comparing said fault output and said de-scrambled set of faults to verify the performance of said built-in self-test circuit.

2. The method according to claim 1 wherein said set of faults comprises an expected faults database file.

3. The method according to claim 1 wherein said high level language comprises one of the group of: VHDL and Verilog.

4. The method according to claim 1 wherein said set of faults comprise any of the group of: stuck at zero and stuck at one.

5. The method according to claim 1 wherein said built in self-test circuit performs any algorithm of the group comprising: March C+, Checkerboard, March A, March B, Diagonal, and Walking 0/1.

6. The method according to claim 1 wherein said step of simulating further comprises:

scrambling said input data and address patterns prior to input into said embedded memory behavior model; and de-scrambling said memory address and data prior to said comparing of said input address and data and said memory address and data in said built-in self-test circuit.

7. A method to verify the performance of a built-in self-test circuit for testing embedded memory in an integrated circuit device comprising:

introducing a set of faults into an embedded memory behavior model Wherein said embedded memory behavior model comprises a high-level language model and wherein each member of said set of faults comprises a finite state machine state, a memory address, and a memory data fault;

thereafter simulating said built-in self-test circuit and said embedded memory behavior model wherein said built-in self-test circuit generates input data and address patterns for said embedded memory behavior model, wherein said input data and address patterns are scrambled prior to input into said embedded memory behavior model, wherein said embedded memory behavior model outputs memory address and data in response to said input data and address patterns, and wherein said memory address and data are de-scrambled and then are compared to said input address and data in said built-in self-test circuit and a fault output is generated if not matching;

de-scrambling said set of faults; and thereafter comparing said fault output and said de-scrambled set of faults to verify the performance of said built-in self-test circuit.

8. The method according to claim 7 wherein said set of faults comprises an expected faults database file.

9. The method according to claim 7 wherein said high-level language comprises one of the group of: VHDL and Verilog.

10. The method according to claim 7 wherein said set of faults comprise any of the group of: stuck at zero and stuck at one.

11. The method according to claim 7 wherein said built-in self-test circuit performs any algorithm of the group comprising: March C+, Checkerboard, March A, March B, Diagonal, and Walking 0/1.

12. An apparatus to verify the performance of a built-in self test circuit for testing embedded memory in an integrated circuit device comprising:

an embedded memory behavior model wherein said embedded memory behavior model comprises a high-level language model;

a built-in self-test circuit model connected to said embedded memory behavior model wherein said built-in self-test circuit model generates input data and address patterns for said embedded memory behavior model, wherein said embedded memory behavior model outputs memory address and data in response to said input data and address patterns, and wherein said memory address and data are compared to said input address and data in said built-in self-test circuit and a fault output is generated if not matching;

a means of introducing a set of faults into said embedded memory behavior model wherein each member of said set of faults comprises a finite state machine state, a memory address, and a memory data fault;

a means of simulating said embedded memory behavior model and said built-in self-test circuit model;

a means of de-scrambling said set of faults; and a means of comparing the fault output of said built-in self-test circuit model and said de-scrambled set of faults to verify the performance of said built-in self-test circuit.

13. The apparatus according to claim 12 wherein said set of faults comprises an expected faults database file.

14. The apparatus according to claim 12 wherein said high-level language comprises one of the group of: VHDL and Verilog.

15. The apparatus according to claim 12 wherein said set of faults comprise any of the group of: stuck at zero and stuck at one.

16. The apparatus according to claim 12 wherein said built-in self-test circuit model performs any algorithm of the group comprising: March C+, Checkerboard, March A, March B, Diagonal, and Walking 0/1.

17. The apparatus according to claim 12 further comprising:

a means of scrambling said input data and address patterns prior to input into said embedded memory behavior model; and a means of de-scrambling said memory address and data prior to said comparing of said input address and data and said memory address and data in said built-in self-test circuit.

18. The apparatus according to claim 12 wherein said built-in self-test circuit model comprises a register transfer level or gate level design.

* * * * *